(12) United States Patent
Tseng et al.

(10) Patent No.: US 6,728,107 B2
(45) Date of Patent: Apr. 27, 2004

(54) MOUNTING ASSEMBLY FOR HEAT SINK

(75) Inventors: Chao Kun Tseng, Tu-Chen (TW); Jianhua Gu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/299,923

(22) Filed: Nov. 18, 2002

(65) Prior Publication Data
US 2004/0017660 A1 Jan. 29, 2004

(30) Foreign Application Priority Data
Jul. 26, 2002 (TW) ...................................... 91211455 U

(51) Int. Cl.⁷ .............................................. H05K 7/20
(52) U.S. Cl. .................... 361/719; 165/80.2; 165/80.3; 165/185; 257/719; 24/296; 24/458; 248/510; 361/704; 361/710
(58) Field of Search ................... 24/295–296, 457–458; 165/80.2, 80.3, 185; 257/718–719, 726, 722; 248/505, 510; 361/704, 707, 709–710, 703, 697, 719–720

(56) References Cited

U.S. PATENT DOCUMENTS

| | | | | |
|---|---|---|---|---|
| 5,870,288 A | * | 2/1999 | Chen | 361/704 |
| 5,991,152 A | * | 11/1999 | Chiou | 361/704 |
| 6,049,457 A | * | 4/2000 | Lee | 361/704 |
| 6,266,245 B1 | * | 7/2001 | Wei | 361/704 |
| 6,507,491 B1 | * | 1/2003 | Chen | 361/697 |
| 6,525,941 B1 | * | 2/2003 | Lai | 361/697 |
| 6,532,153 B1 | * | 3/2003 | Chiu | 361/703 |
| 6,640,884 B1 | * | 11/2003 | Liu | 165/80.3 |

* cited by examiner

Primary Examiner—Gregory D Thompson
(74) Attorney, Agent, or Firm—Wei Te Chung

(57) ABSTRACT

A mounting a heat sink (60) in a mounting frame (80) includes two clips (20) and an operating body (40). Each clip has a central portion (22) and two arms (24) depending from opposite ends of the central portion respectively. Two hooks (28) extend inwardly from a distal end of each arm. The operating body includes a main beam (42), two pressing tabs (44) formed from upper edges of opposite ends of the main beam respectively, and two ears (48) extending coplanarly outwardly from bottom portions of the opposite ends of the main beam respectively. When the pressing tabs are depressed, they drive adjacent arms of the clips to move downwardly until the hooks of said adjacent arms are snappingly engaged in corresponding retaining holes of the mounting frame. Thus the clips press the heat sink to firmly contact an electronic package within the mounting frame.

17 Claims, 4 Drawing Sheets

MOUNTING ASSEMBLY FOR HEAT SINK

BACKGROUND OF THE INVENTION

1. Field of the Invention

The present invention relates to mounting assemblies for heat sinks; and particularly to a mounting assembly which easily and securely mounts a heat sink into a mounting frame, and which requires a relatively small space.

2. Prior Art

A computer central processing unit (CPU) is the core administrator of electrical signals in most contemporary personal computers. Continued development of CPUs has enabled them to perform more and more functions. Heat generated by CPUs has increased commensurately. Measures must be taken to efficiently remove the heat from the CPU. Typically, a heat sink having great heat conductivity is mounted on the CPU to remove heat therefrom. A clip is frequently used to attach the heat sink to the CPU, thus achieving greater efficiency of heat dissipation. However, a single clip received in the heat sink may not be strong enough to securely fasten the heat sink on the surface of the CPU.

Referring to FIG. 4, a mounting assembly for attaching a heat sink to a heat-generating electronic device as disclosed in Taiwan Patent Application No. 86218936 comprises a pair of clips 1 and an operating body 2. An end of each clip 1 is pivotably connected to an end of the operating body 2. A first leg 11 and a second leg 12 respectively extend from two opposite ends of each clip 1. A folded portion 14 is formed between the first leg 11 and a central portion of each clip 1. A pin 141 extends from each lateral edge of upper and lower plates of the folded portion 14. The operating body 2 has two pivoting arms 21 and a handle 23. A pair of holes 22 is defined in each pivoting arm 21, for engagingly receiving the corresponding pins 141 and thereby pivotably connecting the operating body 2 to the clips 1. A distance between the first and second legs 11, 12 of each clip 1 can be adjusted by rotating the operating body 2. Thus, the heat sink can be attached to or detached from the electronic component. However, turning of the handle 23 and the operating body 2 needs a relatively large amount of free space. With the trend toward miniaturization of electronic devices such as computers, the mounting assembly requires unduly great space that could otherwise be used by other components of the computer.

Thus, a mounting assembly which overcomes the above-mentioned problems is desired.

BRIEF SUMMARY OF THE INVENTION

Accordingly, an object of the present invention is to provide a mounting assembly for easily and securely mounting a heat sink in a mounting frame.

Another object of the present invention is to provide a mounting assembly which requires relatively little space.

To achieve the above objects, a mounting assembly of the present invention for mounting a heat sink in a mounting frame includes a pair of clips and an operating body. Each clip has a central portion, and two arms depending from opposite ends of the central portion respectively. A widened fixing portion is formed in an upper region of each arm. A pair of hooks extends inwardly from a distal end of each arm. The operating body includes a main beam, two pressing tabs inwardly formed from upper edges of opposite ends of the main beam respectively, and two ears extending coplanarly outwardly from bottom portions of the opposite ends of the main beam respectively. Two shallow slots are defined in an inner face of the main beam respectively beneath the pressing tabs. The fixing portion of one arm of each clip is fixedly received in a corresponding slot of the operating body. When the pressing tabs of the operating body are depressed, they drive adjacent arms of the clips to move downwardly until the hooks of said adjacent arms are snappingly engaged in corresponding retaining holes of the mounting frame. Thus the clips press the heat sink to firmly contact an electronic package within the mounting frame.

Other objects, advantages and novel features of the present invention will be drawn from the following detailed description of a preferred embodiment of the present invention with the attached drawings, in which:

DETAILED DESCRIPTION OF THE INVENTION

Figure 1:
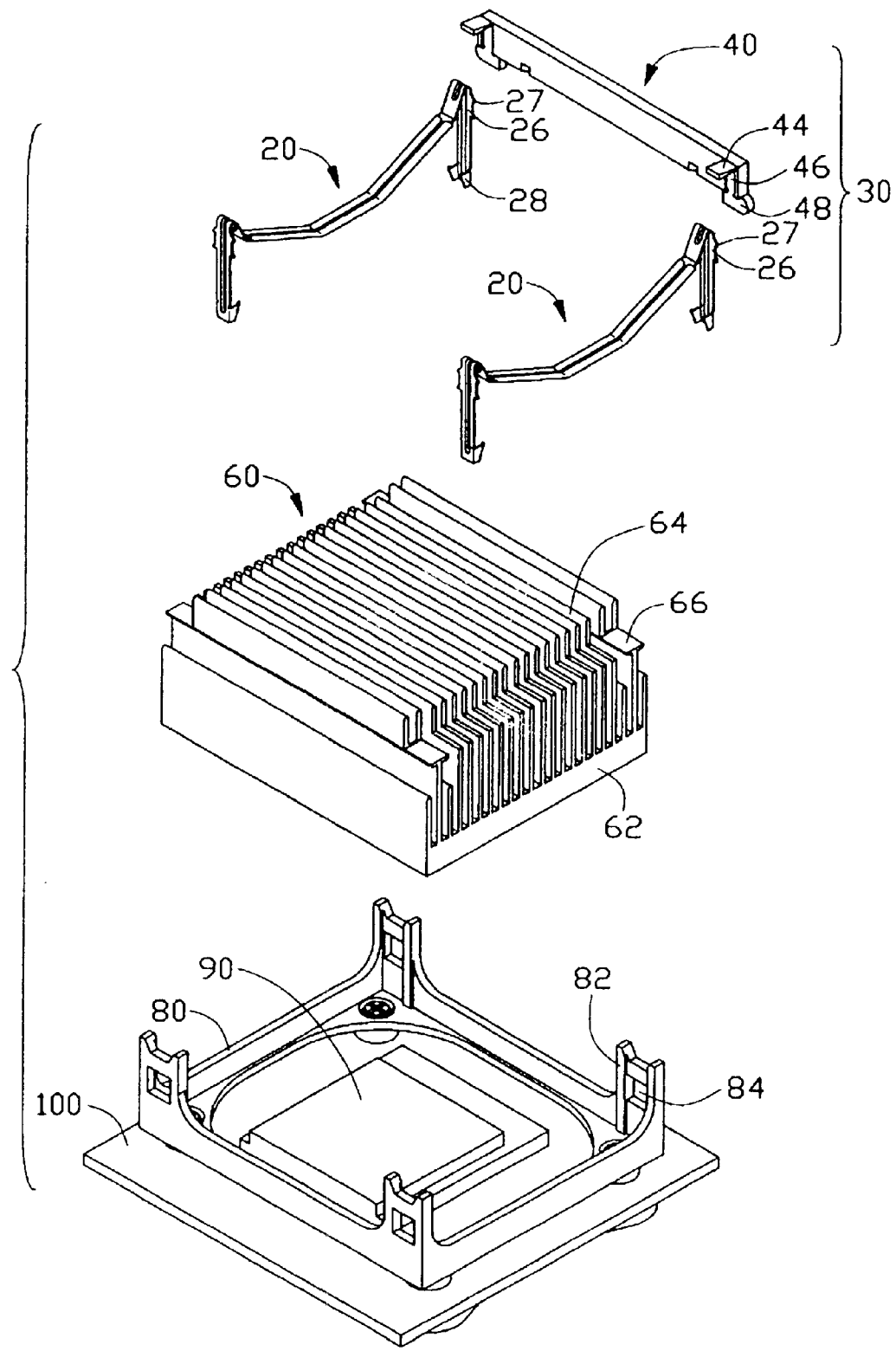
FIG. 1 is an exploded isometric view of a mounting assembly for a heat sink in accordance with the present invention; together with a heat sink, and a mounting frame fixed around an electronic package mounted on a printed circuit board (PCB)

Referring to FIG. 1, a mounting assembly 30 in accordance with a preferred embodiment of the present invention is used to attach a heat sink 60 to a CPU 90 that is mounted on a circuit board 100. The mounting assembly 30 comprises a pair of clips 20 and an operating body 40. A mounting frame 80 is attached to the circuit board 100 around the CPU 90. The mounting frame 80 is generally rectangular. Two pairs of retaining sections 82 respectively extend upwardly from four corners of the mounting frame 80. A retaining hole 84 is defined in each retaining section 82.

The heat sink 60 comprises a chassis 62, and a plurality of fins 64 extending upwardly from the chassis 62. Top portions of respective opposite ends of each fin 64 are cut away. Said ends of the fins 64 thereby cooperatively form a pair of shoulders 66 at opposite sides of the heat sink 60 respectively.

Figure 2:
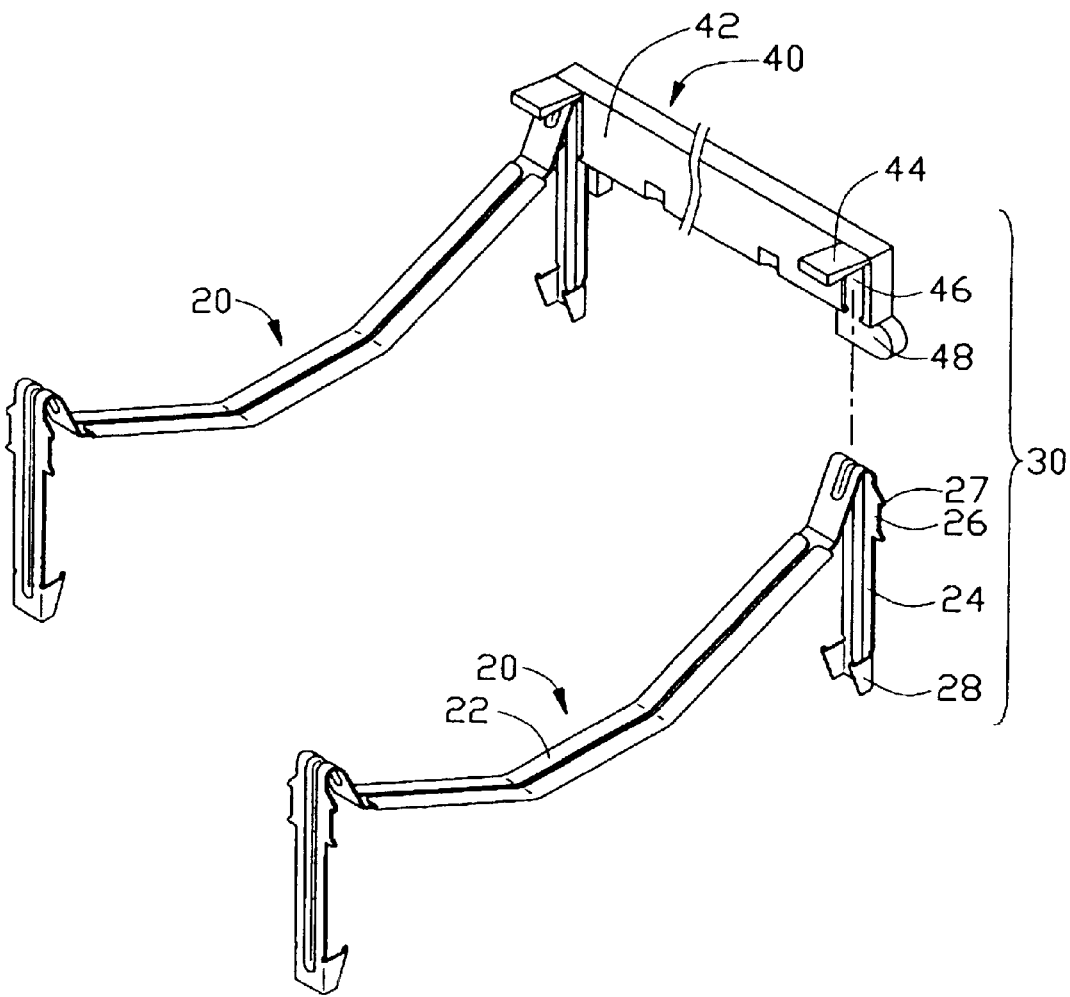
FIG. 2 is an enlarged isometric view of the mounting assembly of FIG. 1 partly assembled.

Referring also to FIG. 2, each clip 20 is generally M-shaped. The clip 20 comprises a central portion 22, and two arms 24 depending from opposite ends of the central portion 22 respectively. A widened fixing portion 26 is formed in an upper region of each arm 24. A plurality of barbs 27 is formed in lateral edges of the fixing portion 26. And a pair of hooks 28 extends inwardly from a distal end of each arm 24, for engaging in a corresponding retaining hole 84 of the retaining section 82 of the mounting frame 80. Each hook 28 has a slanted distal edge.

The operating body 40 is integrally formed, and is preferably made of plastic material. The operating body 40 has a main beam 42, and a pair of pressing tabs 44 inwardly formed from upper edges of opposite ends of the main beam 42 respectively. Two ears 48 extend coplanarly outwardly from bottom portions of the opposite ends of the main beam 42 respectively. A pair of shallow slots 46 is defined in an inner face of the main beam 42, respectively beneath the pressing tabs 44.

Figure 3:
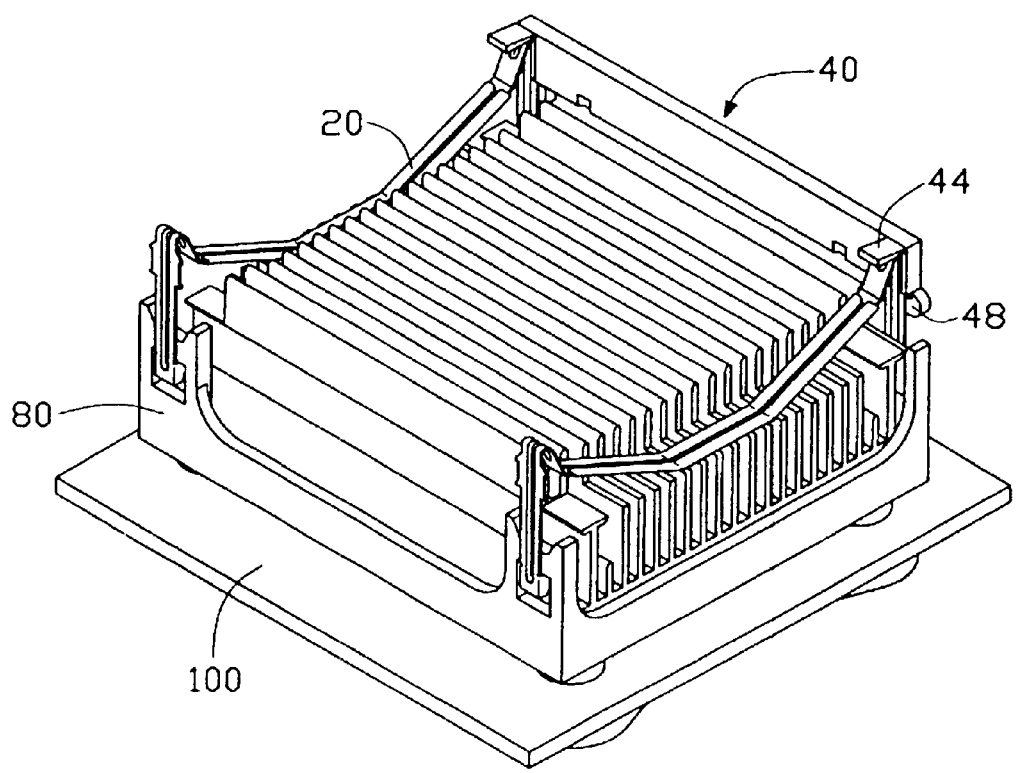
FIG. 3 is a fully assembled view of FIG. 1.
Figure 4:
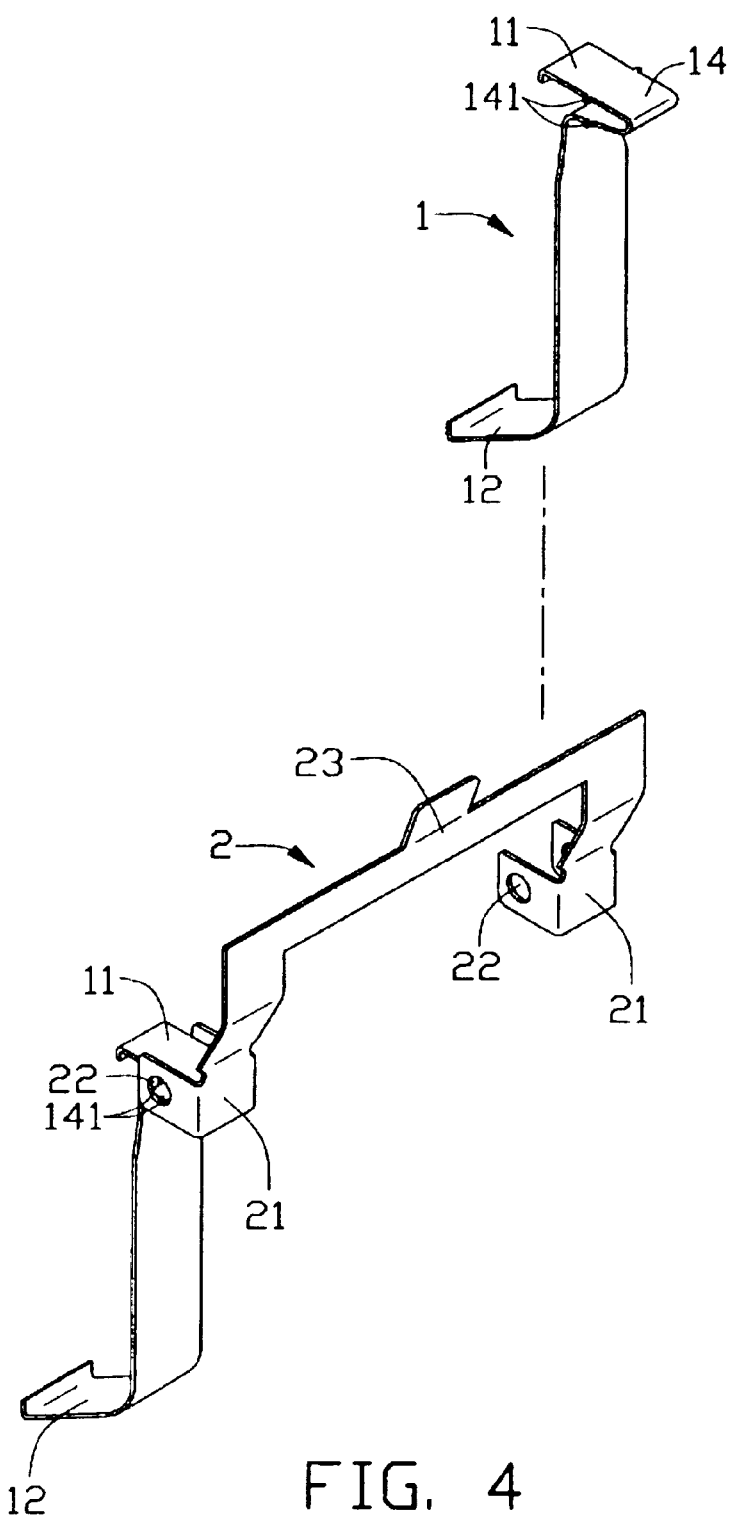
FIG. 4 is an isometric view of a conventional mounting assembly for a heat sink.

Referring also to FIG. 3, in assembly, the fixing portion 26 of one arm 24 of each clip 20 is fixedly received in the corresponding slot 46 of the operating body 40. Each pressing tab 44 of the operating body 40 is disposed immediately above a junction of the central portion 22 and the corresponding fixing portion 26. The ears 48 are located below the corresponding fixing portions 26, and protrude slightly beyond the corresponding arms 24.

In use, the heat sink 60 is placed onto the CPU 90 inside the mounting frame 80. The shoulders 66 of the heat sink 60 are located between corresponding pairs of retaining sections 82 of the mounting frame 80. The clips 20 are placed on the shoulders 66. The central portions 22 of the clips 20 rest on the shoulders 66 respectively. The hooks 28 of the arms 24 that are distal from the operating body 40 are engaged in the corresponding retaining holes 84 of the mounting frame 80. The pressing tabs 44 of the operating body 40 are depressed to drive adjacent arms 24 of the clips 20 to moved downwardly until the hooks 28 of said adjacent arms 24 are snappingly engaged in the corresponding retaining holes 84 of the mounting frame 80. Thus the clips 20 resiliently press the shoulders 66, and the chassis 62 of the heat sink 60 firmly contacts the electronic package 90.

In disassembly, the pressing tabs 44 are depressed, and simultaneously the ears 48 are moved outwardly. This causes the hooks 28 of said adjacent arms 24 to escape from the corresponding retaining holes 84. The hooks 28 distal from the operating body 40 are removed from the corresponding retaining holes 84. The heat sink 60 is then easily removed from the mounting frame 80.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A mounting assembly for attaching a heat sink to a heat-generating device, the mounting assembly comprising:

a pair of clips, each of the clips having a central portion, two arms respectively extending from opposite ends of the central portion, a fixing portion formed in at least one of the arms, and a hook formed at a distal end of each of the arms; and an operating body defining two slots each fixedly receiving a corresponding fixing portion of the clips, the operating body having a pair of pressing portions for driving the arms of the clips.

2. The mounting assembly as claimed in claim 1, wherein the operating body is integrally formed.

3. The mounting assembly as claimed in claim 1, wherein the operating body have a pair of ears adjacent corresponding arms of the clips for facilitating operation.

4. The mounting assembly as claimed in claim 1, wherein a plurality of barbs is formed in lateral edges of the fixing portion of at least one of the arms of the clips.

5. The mounting assembly as claimed in claim 1, wherein the operating body is made of plastic material.

6. A heat dissipating assembly comprising:

a circuit board having an electronic package mounted thereon;

a mounting frame attached to the circuit board around the electronic package, the mounting frame defining a plurality of holes;

a heat sink mounted to the electronic component, the heat sink comprising a chassis and a plurality of fins arranged on the chassis;

a pair of clips attaching the heat sink to the electronic package, each of the clips having a central portion pressing on the heat sink and two arms respectively extending from opposite ends of the central portion, a hook being formed at each of the arms and engaging in a corresponding hole of the mounting frame; and an operating body defining a pair of slots fixedly receiving corresponding arms of the clips, the operating body having a pair of pressing portions for downwardly pressing the arms of the clips to allow the hooks of the clips to engage in corresponding holes of the mounting frame.

7. The heat dissipating assembly as claimed in claim 6, wherein the fins are cut away at respective opposite ends thereof to respectively form two shoulders.

8. The heat dissipating assembly as claimed in claim 7, wherein the clips rest on the shoulders.

9. The heat dissipating assembly as claimed in claim 6, wherein the operating body has a pair of ears adjacent corresponding arms of the clips for facilitating operation.

10. The heat dissipating assembly as claimed in claim 6, wherein a fixing portion is formed in an upper region of at least one arm of each of the clips, the fixing portion engaging in a corresponding slot of the operating body.

11. The heat dissipating assembly as claimed in claim 10, wherein a plurality of barbs is formed in lateral edges of the fixing portion of at least one of the arms of the clips.

12. The heat dissipating assembly as claimed in claim 6, wherein the operating body is made of plastic material.

13. The heat dissipating assembly as claimed in claim 6, wherein the operating body is integrally formed.

14. A heat sink assembly comprising:

a heat sink defining lengthwise and lateral directions perpendicular to each other;

a pair of clips respectively located on two sides of the heat sink and extending in said lengthwise direction, each of said clips including a central portion pressing upon the heat sink, and a pair of arms respectively extending downwardly from two opposite ends of the central portion for latching to a device mounted upon a printed circuit board; and at least one operating body extending in said lateral direction and located at one lengthwise end of the heat sink with the corresponding arms of said pair of clips commonly attached thereto, so that the pair of clips and the operating body are operated as one piece; wherein said operating body includes a pair of ears outwardly respectively extending, along said lateral direction, from two opposite lateral ends thereof for easy manual access and operation.

15. The assembly as claimed in claim 14, wherein said operating body is not moveable relative to the clips.

16. The assembly as claimed in claim 14, wherein said central body and the corresponding pair of arms of each of said pair of clips are integrally formed from one piece.

17. The assembly as claimed in claim 14, wherein said body further includes a pair of upwardly facing pressing tabs respectively around the corresponding pair of ears, respectively.

* * * * *